(12) United States Patent
Juntunen et al.

(10) Patent No.: US 9,882,070 B2
(45) Date of Patent: Jan. 30, 2018

(54) PHOTODETECTOR STRUCTURES AND MANUFACTURING THE SAME

(71) Applicant: Aalto University Foundation, Espoo (FI)

(72) Inventors: Mikko Juntunen, Kirkkonummi (FI); Hele Savin, Espoo (FI); Päivikki Repo, Vantaa (FI); Ville Vähänissi, Vantaa (FI); Antti Haarahiltunen, Perttula (FI)

(73) Assignee: AALTO UNIVERSITY FOUNDATION, Espoo (FI)

( * ) Notice: Subject to any disclaimer, the term of this patent is extended or adjusted under 35 U.S.C. 154(b) by 0 days.

(21) Appl. No.: 15/178,665

(22) Filed: Jun. 10, 2016

(65) Prior Publication Data

US 2017/0358694 A1    Dec. 14, 2017

(51) Int. Cl.
| | |
|---|---|
| H01L 31/102 | (2006.01) |
| H01L 31/0216 | (2014.01) |
| H01L 31/103 | (2006.01) |
| H01L 31/0224 | (2006.01) |
| H01L 31/0236 | (2006.01) |
| H01L 31/028 | (2006.01) |
| H01L 31/18 | (2006.01) |

(52) U.S. Cl.
CPC ...... *H01L 31/02161* (2013.01); *H01L 31/028* (2013.01); *H01L 31/02363* (2013.01); *H01L 31/022466* (2013.01); *H01L 31/103* (2013.01); *H01L 31/1804* (2013.01); *H01L 31/1884* (2013.01)

(58) Field of Classification Search
CPC .......... H01L 27/1462; H01L 31/02161; H01L 31/0236–31/02366
See application file for complete search history.

(56) References Cited

U.S. PATENT DOCUMENTS

| | | | |
|---|---|---|---|
| 8,207,444 B2* | 6/2012 | Cousins | H01L 31/02243 136/252 |
| 2007/0158709 A1* | 7/2007 | Mouli | H01L 27/14601 257/291 |

OTHER PUBLICATIONS

Savin, et al.: "Black silicon solar cells with interdigitated back-contacts achieve 22.1% efficiency," Nature Nanotechnology, vol. 10, Jul. 2015, pp. 624-629. Pubklished online May 18, 2015.*
Savin, et al.: "Black silicon solar cells with interdigitated back-contacts achieve 22.1% efficiency," Nature Nanotechnology, vol. 10, Jul. 2015, pp. 624-629.
T. E. Hansen: "Silicon UV-Photodiodes Using Natural Inversion Layers," Physica Scripta, vol. 18, pp. 471-475, 1978.
(Continued)

*Primary Examiner* — Daniel Shook
(74) *Attorney, Agent, or Firm* — Buchanan, Ingersoll & Rooney PC

(57) ABSTRACT

A photodetector structure comprises a semiconductor substrate extending substantially along a horizontal plane and having a bulk refractive index and a front surface defining a front side of the photodetector structure. The front surface comprises high aspect ratio nanostructures forming an optical conversion layer having an effective refractive index gradually changing towards the bulk refractive index to reduce reflection of light incident on the photodetector structure from the front side thereof. Further, the semiconductor substrate comprises an induced junction.

13 Claims, 3 Drawing Sheets

(56) References Cited

OTHER PUBLICATIONS

Sildoja, et al.: "Predictable quantum efficient detector: I. Photodiodes and predicted responsivity," IOP Publishing, Metrologia, vol. 50, (2013) pp. 385-394.

Valluru: "Surface Passivated Black Silicon Photodetectors With Induced Junction", Master's Thesis, Aalto University of Electrical Engineering, Department of Micro Nanotechnology, Jun. 24, 2015, pp. 1-55.

* cited by examiner

PHOTODETECTOR STRUCTURES AND MANUFACTURING THE SAME

BACKGROUND

Various types of semiconductor photodetectors such as photodiodes are widely used in different light sensing applications, for example, in imaging and non-imaging light sensing systems for medical, security, and industrial applications as well as in solar cells.

Typically, a semiconductor photodetector comprises a photodiode based on a p-n junction. A p-n junction is commonly formed by implanting foreign impurities on a semiconductor substrate surface, i.e. impurities of different conductivity type than the semiconductor substrate, and annealing the implanted region. Oxide may then be grown for passivation purposes on the surface of the structure comprising the p-n junction. Contacts may be formed to the semiconductor regions with different conductivity types, for example, by etching openings and forming electrically conductive contact structures into the openings and/or by forming electrically conductive contact layer(s) on the substrate.

Anti-reflection structures, properties of the p-n junction, and various surface structures have been developed to optimize the general as well as application-specific performance of photodetectors. After development, the performance of prior art photodetectors, especially the sensitivity thereof, has more or less saturated. To achieve greater improvements in the detecting performance, clearly new approaches should be provided.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, a photodetector structure is disclosed which may be used, for example, for various types of camera light and illumination meters such as ambient light sensors (ALS), camera shutter controls, imaging and x-ray imaging systems, smoke detectors, twilight detectors, fiber optic links, position sensors, and photodetectors in computed tomography (CT) systems, in just to mention a few examples without any intention to limit the scope of possible applications. In general, the photodetector may be used in any imaging or non-imaging light sensing or light energy collecting devices and systems.

The photodetector structure comprises a semiconductor substrate extending substantially along a horizontal plane, the semiconductor substrate having a bulk refractive index and a front surface defining a front side of the photodetector structure. The front surface of the semiconductor substrate comprises high aspect ratio nano structures forming an optical conversion layer having an effective refractive index gradually changing towards the bulk refractive index to reduce reflection of light incident on the photodetector structure from the front side of thereof. Further, the semiconductor substrate comprises an induced junction.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein:

In FIGS. 1 to 3, the photodetector structures are illustrated as are schematic sectional side views which are not in scale. The method of FIG. 4 is illustrated as schematic sectional side views of the photodetector structure at different phases or stages of the method. The drawings are not in scale.

DETAILED DESCRIPTION

The detailed description provided below in connection with the appended drawings is intended as a description of a number of embodiments and is not intended to represent the only forms in which the embodiments may be constructed, implemented, or utilized.

Figure 1:
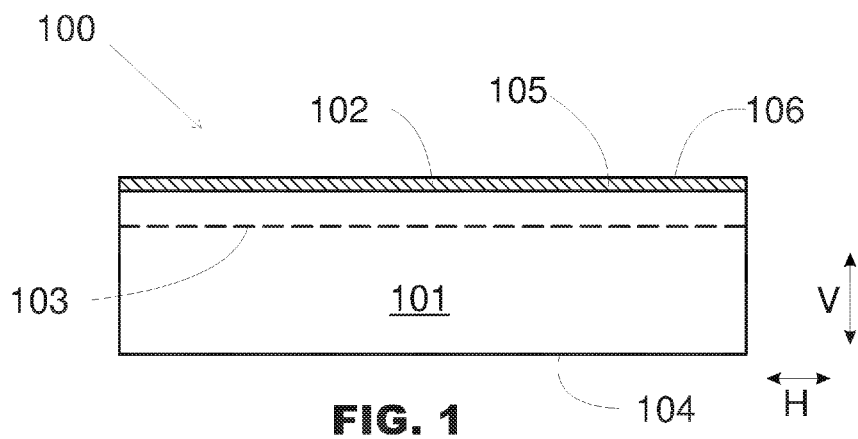
FIGS. 1 to 3 illustrate various photodetector structures.

The photodetector structure 100 of FIG. 1 comprises an n-type semiconductor substrate 101 extending substantially along, i.e. parallel to, a horizontal plane and having a front surface 102 defining a front side of the photodetector structure.

A "photodetector structure" refers to a structure which may form a part of, or form completely, a photodetector. Thus, a complete, operable photodetector may comprise layers and structures additional to the photodetector structure. On the other hand, a photodetector structure may alternatively comprise all essential parts of an operable photodetector.

A "photodetector", in turn, refers to a semiconductor component capable of converting incident light energy, absorbed in the photodetector, into electric signal(s) and/or electrical energy. The primary purpose of a photodetector may be sensing of light or collecting and converting light energy into electrical energy. "Light" refers to ultraviolet, visible, and infrared regions of the electromagnetic spectrum.

A "photodetector" may be a complete, stand-alone light sensing component. Alternatively, it may form an integral part of a larger detector assembly, such as an array of photodetector elements. For example, a plurality of photodetectors or photodetector elements may be arranged to form a sensor where each photodetector or photodetector element forms one pixel of the sensor.

An "n-type semiconductor substrate" refers to a semiconductor substrate comprising one or more semiconductor materials with n-type conductivity. The n-type conductivity may result from inherent properties of the semiconductor material(s), or it may be achieved by suitable impurities present in the semiconductor material(s).

"Extending substantially along a horizontal plane" refers to a generally layer-formed structure of the semiconductor substrate 101 having dimensions in the horizontal directions H substantially larger than the dimensions in the vertical direction V.

In the context of this specification, "horizontal" and "vertical" are to be understood as auxiliary definitions observed in fictitious coordinates fixed to the photodetector structure itself. Thus, a fictitious plane parallel to which the semiconductor substrate extends, i.e. has its largest dimensions, is selected to define and represent the "horizontal" directions H, whereas "vertical" refers to the directions perpendicular to such horizontal plane. Naturally, when observed in external coordinates, such as the ones fixed to the direction of the gravity of Earth, with "horizontal" and "vertical" referring to directions perpendicular and parallel, respectively, to the direction in which the gravity of Earth works, the semiconductor substrate may lie in any direction.

The "front side" of the photodetector structure, defined by the front surface of the semiconductor substrate, refers to the side of the photodetector structure from which side the light is intended to be incident on and received by the photodetector structure.

In a generally layer-formed semiconductor substrate extending horizontally, there are two opposite, horizontal main surfaces capable of serving as the front surface of the semiconductor substrate. The one of those surfaces opposite to the surface selected as the front surface 102 can be considered as the "back surface" 104 of the semiconductor substrate.

The photodetector structure 100 of FIG. 1 further has a transparent oxide layer 105 having a negative net charge on the front surface of the semiconductor substrate. In other embodiments, other transparent layers with sufficient negative net charge may be used instead of an oxide layer.

"Transparent" refers to the oxide layer's capability of transmitting a main portion of the light energy, at a relevant wavelength range, incident on the free surface 106 of the oxide layer. Relevant wavelength range refers to the intended operation wavelengths of the photodetector structure. For example, the oxide layer may transmit 50% or more, e.g. 80% or more, of light energy at the relevant wavelength range incident on the free surface of it. The higher the transparency is the higher sensitivity the photodetector structure may have.

The negative net charge of the oxide layer may be an inherent property of the oxide layer, or it may result inevitably from the manufacturing method thereof. It may also be adjustable by proper selection of the manufacturing process parameters.

For example, the resulting net charge of the oxide layer depends on the surface pretreatment before oxidation. Relevant factors include the actual cleaning method used, possible allowance of formation of native oxide, and possible chemical oxides resulting from cleaning. The resulting net charge also depends on the particulars of the oxide deposition process, such as the precursor materials, deposition and purge cycle durations, temperatures, etc. The net charge of the oxide layer may further be affected by post treatment of the deposited oxide layer, for example, by annealing and/or exposing to various pressures and atmospheres.

The net charge required to achieve induced junction depends on the substrate carrier density. In case of a very high resistivity material with low carrier density, even less than a net charge of $1.10^9$ e/cm$^3$ may induce inversion. With resistivities more typical in solar industry, the lower limit may lie in the range of $1.10^{11}$ e/cm$^3$.

In the semiconductor substrate 101, at a distance from the front surface 102 thereof, there is an induced junction 103 formed due to the presence of, i.e. induced by, the negative net charge of the oxide layer 105.

As known for a skilled person, an "induced junction" refers to an inversion region formed in a semiconductor, induced by an external charge of the same conductivity type as the semiconductor. For example, when a negatively charged material layer is deposited on top of n type silicon, the generated electric field attracts holes towards the surface. If the field is strong enough and the doping concentration of silicon is low enough, the holes will invert a thin layer of silicon into p type. Since the inversion layer and the bulk are in contact, they will effectively form a p-n junction and the system will behave as a diode. The same principle also applies for p type substrates if the oxide charge is positive.

Inversion refers to a region where the minority carrier concentration exceeds the majority carrier concentration. This may be called weak inversion limit. If the minority carrier concentration also exceeds the bulk doping concentration, strong inversion is achieved.

Thus, an induced junction may be formed in an-type semiconductor when sufficient external negative net charge attract the holes in the n-type semiconductor substrate in such extent that inversion is created in the semiconductor substrate, resulting in an induced "p on n" junction, i.e. an induced junction.

Thus, instead of a conventional p-n junction based on two semiconductor regions with opposite conductivity types, an induced junction is formed within a single semiconductor region of a given conductivity type, induced by external charge, i.e. charge outside the semiconductor substrate, representing the same conductivity type as the semiconductor region. In the photodetector structure 100 of FIG. 1, such external charge suitable for forming the induced junction in the n-type semiconductor substrate 101 is provided by the negative net charge of the oxide layer 105.

The induced junction serves in the photodetector structure for the same purpose and function as a p-n junction in a conventional photodiode or other type of photodetector based on a p-n junction. Thus, free carriers generated in the semiconductor material of the semiconductor substrate via absorption of light may be collected to different sides of the induced junction and the depletion region thereof.

The combination of an n-type semiconductor substrate and an induced junction may provide various advantages. For example, the induced junction induced by the negative charge provided by the negatively charged oxide layer enables manufacturing and having a diode-type photodetector without need for p-type ion implantation which typically increases recombination of the free charge carriers. Thus, a photodetector structure with low surface recombination may be implemented. Further, the oxide layer providing the negative net charge required to form the induced junction also serves for efficient passivation of the front surface of the semiconductor substrate.

The n-type semiconductor substrate 101 may comprise any n-type semiconductor suitable for photodetector structures. For example, it may comprise n-type silicon.

Correspondingly, the oxide layer 105 may comprise any suitable, optically transparent oxide having sufficient negative net charge to form the induced junction. One example is $Al_2O_3$ which may be used, for example, in a photodetector structure where the semiconductor substrate comprises n-type silicon.

The semiconductor substrate and/or the oxide layer "comprising" a specific substance refers to presence of at least that substance in the semiconductor substrate and/or the oxide layer, without excluding possible presence of some other substance(s) also.

Figure 2:
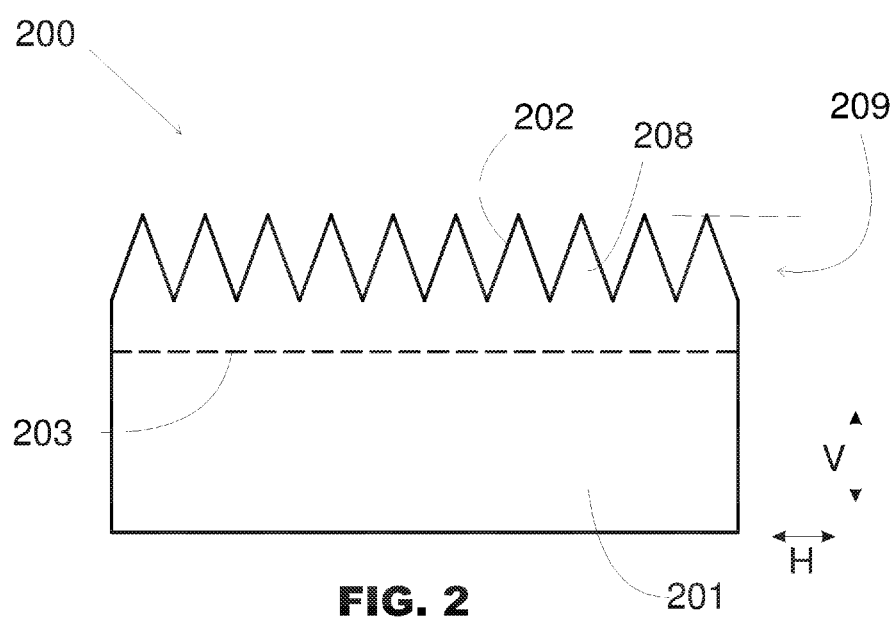

Similarly to the photodetector of FIG. 1, the photodetector structure 200 of FIG. 2 comprises semiconductor substrate 201 extending substantially in horizontal directions H and having a front surface 202 defining a front side of the photodetector structure. The semiconductor substrate may be of any conductivity type.

The front surface 202 of the semiconductor substrate 201 comprises a plurality of high aspect ratio nanostructures 208 extending substantially vertically, i.e. perpendicularly to the "horizontal" direction in which the semiconductor substrate 201 extends.

"Nanostructure" refers to a structure having at least one characteristic dimension in the sub-micron range, i.e. equal to or less than a micrometer. From an optical point of view, such dimensions fall substantially in the range of, or below, the relevant detection wavelengths of typical photodetectors. As known for a skilled person, sub-wavelength features or features substantially in the range of the relevant wavelength may affect the propagation of light differently from a bulk material.

"High aspect ratio" nanostructures extending substantially vertically refer to structures having their height in the vertical direction V multiple times their horizontal dimensions. Such nanostructures may comprise, for example, cylindrical or conical pillars, narrow pyramids, or inverse shapes thereof in the form of corresponding cavities.

The nanostructures 208 may have their average height in the vertical direction in the range of 500 to 1500 nm, for example, about 600 or 800 to 1000 nm, and their average width in the horizontal direction in the range of 50 or 100 to 400 nm, for example, 200 to 300 nm.

The semiconductor substrate 201 has a bulk refractive index, i.e. a refractive index by the semiconductor substrate material(s).

The nanostructures form an optical conversion layer 209 in which, due to the dimensions of the nanostructures in the range of or below the relevant wavelength range, the light behaves differently from the semiconductor substrate bulk material. The optical conversion layer has an effective refractive index which gradually changes from the ambient refractive index of the material in contact with the nanostructures towards the bulk refractive index to reduce reflection of light incident on the photodetector structure from the front side thereof. For example, where the photodetector structure is designed to be used as exposed to ambient air with refractive index of 1, the effective refractive index gradually changes from 1 to the bulk refractive index. Thus, the average effective refractive index is set between the ambient and the bulk refractive indices.

"Effective refractive index" is an auxiliary definition related to interaction of light with a nanostructured material layer. Nanostructures in the range of or below the relevant wavelengths make the light behave in such a nanostructured layer differently from a corresponding layer of the same material without the nanostructures. This different behavior can be described by the auxiliary term "effective refractive index"; light behaves in, and interacts with, such nanostructured material layer as if the layer would be made of a gradually changing bulk material having, at each level of the conversion layer, a refractive index equal to the effective index at that level.

The semiconductor substrate 201 may comprise silicon. In that case, the optical conversion layer 209 may comprise black silicon. The silicon may be of n-type or p-type conductivity.

As known for those skilled in the art, "black silicon" refers to a nanostructuring on a surface of silicon, producing an optical conversion layer having a gradually changing effective refractive index. Black silicon has been reported, for example, for use as an antireflection layer on a front surface of a p-type silicon solar cell having its p-n junction on the back side thereof. Similar construction may be implemented in photodetector or photodiode structure also.

In the embodiment mentioned above, black silicon is utilized on the front surface of the semiconductor substrate of the photodetector structure, i.e. on the same side of the structure as the induced junction 203 forming the actual active part of the structured. The induced junction may be induced by any appropriate means, such as an oxide layer (not illustrated in FIG. 3) with a suitable net charge.

The optical conversion layer, possibly comprising black silicon, may improve the overall sensitivity of the photodetector structure via reduced reflection of light incident on the photodetector structure from the front side thereof. Further, the anti-reflection performance of the optical conversion layer may have very low temperature dependence.

Figure 3:
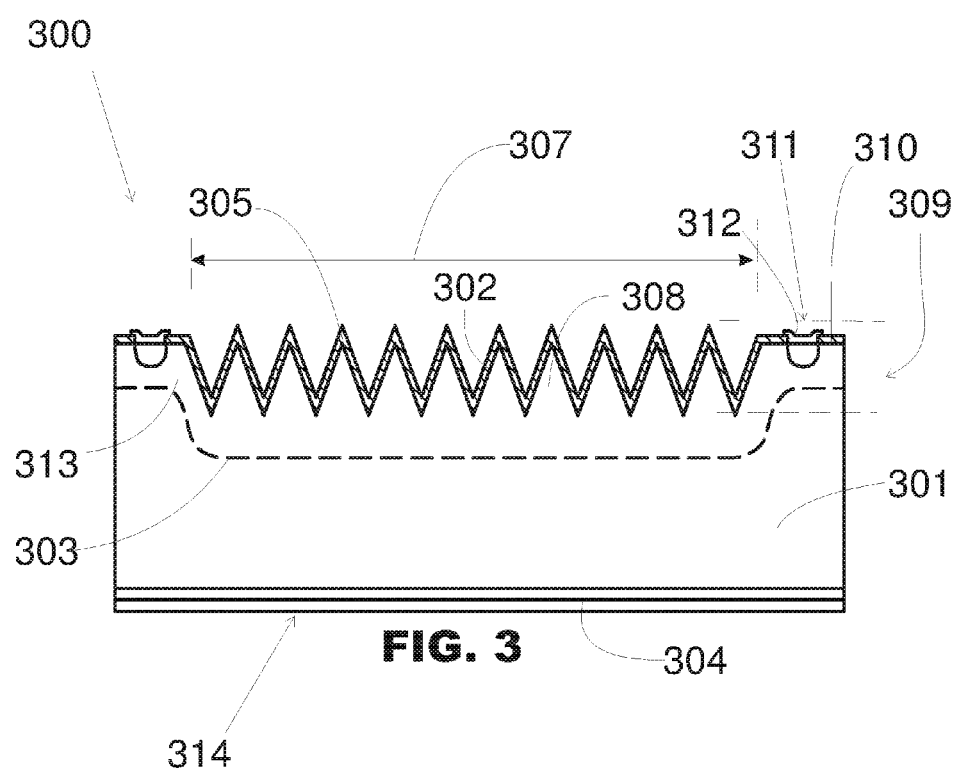

The photodetector structure 300 of FIG. 3 differs from that discussed above with reference to FIG. 1 in that the front surface 302 of the semiconductor substrate 301 comprises a structured region 307 where the front surface comprises a plurality of high aspect ratio nanostructures 308 extending substantially vertically, i.e. perpendicularly to the front surface. The nanostructures 308 may be in accordance with those discussed above with reference to FIG. 2.

In comparison to the photodetector structure 200 illustrated in FIG. 2, the photodetector structure 300 of FIG. 3 differs from the former by the presence of the optically transparent, negatively charged oxide layer 305. The n-type conductivity of the semiconductor substrate 301 represents a specific embodiment of the generic semiconductor substrate of the photodetector structure 200 of FIG. 2.

As discussed above with reference to FIG. 1, the oxide layer 305 may comprise, for example, negatively charged aluminum oxide $Al_2O_3$ or any other suitable transparent oxide layer with sufficient negative net charge to induce the induced junction 303.

In the photodetector structure 300 of FIG. 3, the optically transparent oxide layer 305 follows substantially conformally, i.e. with substantially uniform layer thickness, the nanostructured front surface 302 of the semiconductor substrate in the structured region 307 thereof. Such conformal coverage may be achieved by forming the oxide layer, for example, by atomic layer deposition ALD.

In one embodiment, the semiconductor substrate 301 comprises n-type silicon. Then, the optical conversion layer 309 may comprise black silicon.

In the photodetector structure 300, the front surface 302 of the semiconductor substrate 301 comprises also a circumferential non-structured, flat region 310 at the edge region of the photodetector structure, which flat region is free of the nanostructures. Electrically conductive circumferential front contact 311, serving as an anode contact, is formed in the flat region, in circumferential opening 312 formed in the oxide layer 305. The front contact extends through the front surface 302 of the semiconductor substrate to an upper part 313 of the semiconductor substrate above the induced junction 303.

In other embodiments, instead of a continuous, circumferential flat region and respective circumferential opening in the oxide layer and circumferential front contact, there may be any number of discrete flat regions and respective discrete openings and contacts at different locations of a photodetector structure.

"Upper" and "above" are to be understood as auxiliary definitions when observing the photodetector in the above fictitious coordinated fixed to the photodetector structure itself. In that terminology, "upwards" refers to the vertical direction directed from the back surface of the semiconductor substrate towards the front surface thereof.

Further, the semiconductor substrate 301 has a back surface 304 opposite to the front surface 302, and an electrically conductive back contact 314, serving as a cathode contact, is formed, in the form of a contact layer, on and adjacent to the back surface.

The front and the back contacts 311, 314 may be made, for example, as comprising a metal and/or any other suitable material with sufficiently high electrical conductivity. The front and the back contacts provide means for connecting the photodetector to an external circuitry. Such external circuitry may be used for biasing the induced junction 303 if needed, and for collecting the electrical signal(s) generated in response to absorption of light in the photodetector structure 300.

In other embodiments, instead of a continuous back contact layer, a photodetector structure may comprise any number of discrete back contact elements or structures.

In addition to anode and cathode contacts, a photodetectors structure may comprise an additional contact structure in the form of a guard ring. A "guard ring" refers to a circumferential or annular contact structure encircling the associated anode or cathode contact. The presence of a guard ring may be used to collect leakage current which would otherwise flow across the photodetector structure edges, disturbing the light generated current collected from the anode contact.

Further, in yet other embodiments, instead of one single continuous cathode contact or a plurality of discrete cathode contacts formed on the back surface of the semiconductor substrate, one or more cathode contacts may be formed on the front surface thereof also. Thus, embodiments are possible with both anode contact(s) and cathode contact(s) lying on the front surface of the semiconductor substrate.

To improve the back contact performance and current spreading at the back surface of the semiconductor substrate, the semiconductor substrate may comprise, for example, a back surface layer having higher n-type conductivity than the rest of the semiconductor substrate. Correspondingly, p-type doping may be arranged close to the front surface of the semiconductor substrate to improve the contact between the front contacts and the inversion region or layer. The structures of front and back contacts are discussed in more detail with reference to FIG. 4 below.

Naturally, front and back contact structures may be also present in photodetector structures in accordance with those discussed above with reference to FIGS. 1 and 2. In the case of a photodetector of FIG. 1, having no nanostructuring on the front surface of the semiconductor substrate, no specific flat regions are needed because front contacts may be formed anywhere in the substantially flat front surface of the semiconductor substrate, naturally taking into account the optical performance of the photodetector structure.

Above, mainly structural and material aspects of photodetector structures are discussed. In the following, more emphasis will lie on manufacturing aspects related to photodetector structures. What is said above about the ways of implementation, definitions, details, and advantages related to the structural and material aspects apply, mutatis mutandis, to the method aspects discussed below. The same applies vice versa.

Figure 4:
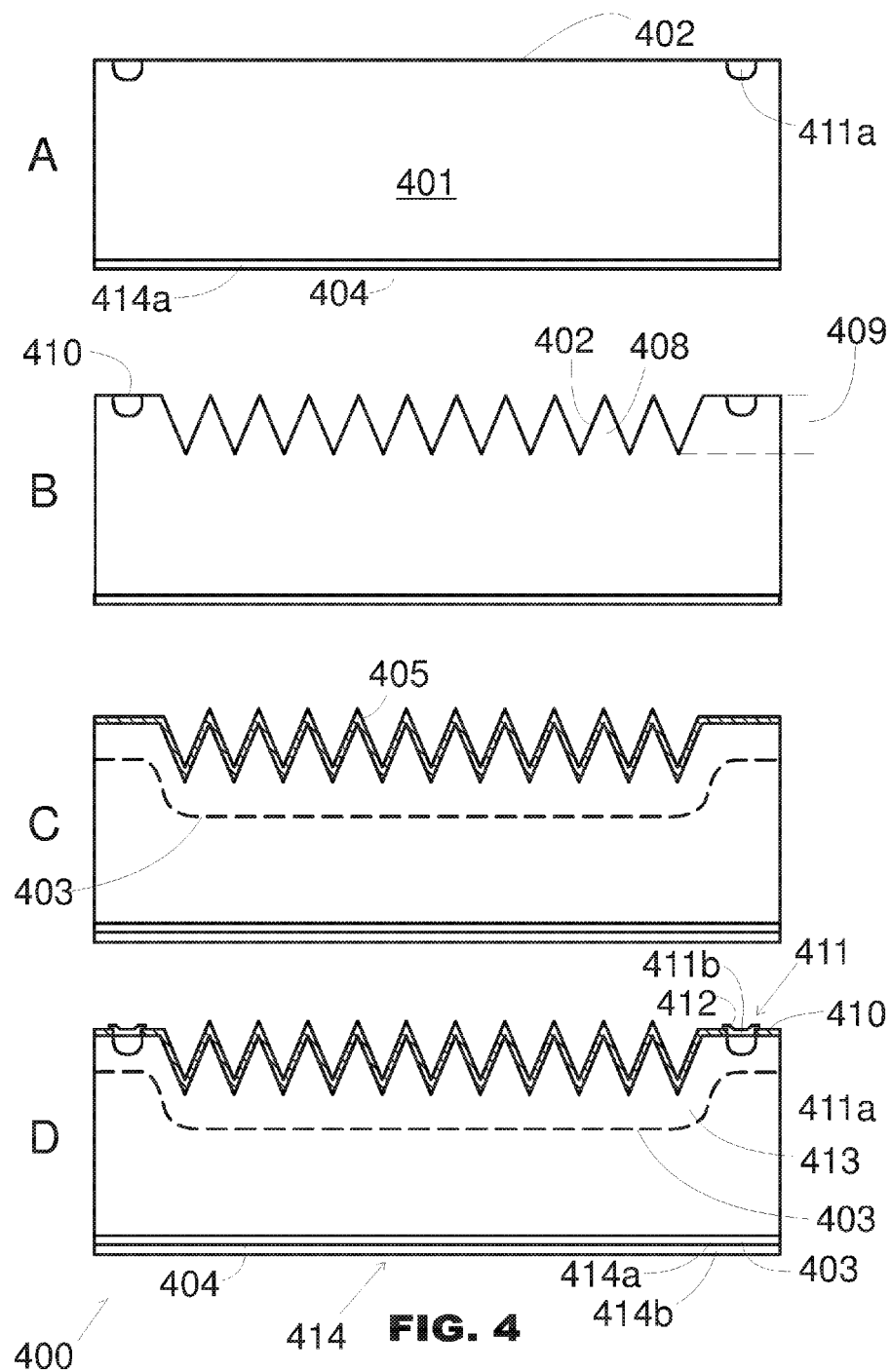
FIG. 4 illustrates a method for manufacturing a photodetector structure.

The method of FIG. 4 may be used for manufacturing a photodetector structure 400 which may be, for example, in accordance with that discussed above with reference to FIG. 2 or 3.

The method starts by providing a semiconductor substrate 401 extending substantially along a horizontal plane and having a bulk refractive index and a front surface 402 which defines a front side of the photodetector structure.

The semiconductor substrate may be formed as a substrate for one single photodetector. Alternatively, it may comprise an integral substrate structure for a plurality of photodetector structures.

As first actual action of the method, in operation A, a circumferential p+ doped region 411a is formed in the semiconductor substrate as extending from the front surface 402 of the to a predetermined depth into the semiconductor substrate adjacent to the front surface 402 thereof. The p+ doped region may be formed, for example, by implantation of suitable ions into the semiconductor substrate. Ion implantation may be followed by annealing in an elevated temperature. Further, an n+ doped surface layer 414a is formed in the semiconductor substrate adjacent to the back surface 404 thereof. Similarly to the p+ doped region of the front contact, the n+ doped region may be formed, for example, by ion implantation, possibly followed by annealing.

The purpose of the p+ doped region 411a and the n+ doped surface layer 414a is to serve as part of the front/anode and back/cathode contact, respectively, of the complete photodetector structure.

The front surface of the semiconductor substrate is structured, in operation B, so as to form substantially vertically extending high aspect ratio nanostructures 408 thereon. Thereby, an optical conversion layer 409 is formed, having an effective refractive index gradually changing towards the bulk refractive index to reduce reflection of light incident on the photodetector structure from the front side thereof.

In structuring the front surface of the semiconductor substrate, any suitable known techniques and processes may be used. For example, high aspect ratio nanostructures may be formed by laser texturization, plasma immersion ion implantation, metal-assist wet etching, or cryogenic deep reactive ion etching (DRIE). In the embodiment illustrated in FIG. 4, structuring is applied on a central area of the front surface 402 only, thereby leaving a circumferential flat region 410 at the edge area of the front surface non-structured, i.e. without nanostructures. The flat region and the p+ doped region 411a are aligned so that the p+ doped region lies on the area of the flat region 410.

Depending on the technique used for structuring the front surface of the semiconductor substrate, various alternative approaches may be used to leave the flat region 410 without structuring. In some techniques, such as laser texturization, it may be sufficient to control the structuring spatially so that no structuring is applied on area(s) for flat region(s). On the other hand, for example, in techniques comprising etching the front surface of the semiconductor substrate, a mask layer may be formed on the front surface of the semiconductor substrate, the mask layer comprising a mask region and an open region. Such mask layer may prevent formation of the high aspect ratio nanostructures on the front surface of the semiconductor substrate below the mask region during etching. Thereby, a flat region remains below each mask region, and a front contact may then be formed thereon after removal of the mask layer.

In operation C, external negative or positive charge, depending on the conductivity type of the semiconductor substrate, is provided on the front surface of the semiconductor substrate so as to induce an induced junction 403 in the semiconductor substrate. In the embodiment illustrated in FIG. 4, the external charge is provided by forming an additional layer 405 having a positive or negative net charge, depending on the conductivity type of the semiconductor substrate, on the front surface of the semiconductor substrate.

In one embodiment, the semiconductor substrate provided in operation A comprises n-type silicon, and the conversion layer 409 is formed in operation B so as to comprise black silicon.

With n-type silicon providing n-type conductivity of the semiconductor substrate, the external charge shall be negative to form the induced junction 403. In one embodiment, providing the external negative charge comprises forming a transparent oxide layer with a negative net charge, the oxide layer covering substantially conformally the front surface of the semiconductor substrate with the nanostructures. In this embodiment, the induced junction 403 is induced by the negative net charge of the oxide layer as the additional layer 405. The oxide layer with negative net charge may comprise, for example, aluminum oxide $Al_2O_3$.

The oxide layer comprising aluminum oxide may be formed, for example, by atomic layer deposition ALD.

"Atomic layer deposition", sometimes called atomic layer epitaxy ALE, refers to a process, wherein a substrate is alternately exposed to at least two precursors, one precursor at a time, to form on the substrate a coating by alternately repeating essentially self-limiting surface reactions between the surface of the substrate (on the later stages, naturally, the surface of the already formed coating layer on the substrate) and the precursors. As a result, the coating material is "grown" on the substrate molecule layer by molecule layer. This enables accurate and well controlled production of thin film coatings.

In the above embodiment, ALD enables forming the oxide layer with well-defined thickness and excellent conformity with the nanostructured front surface of the semiconductor substrate.

To provide appropriate contacts in the photodetector structure, the method illustrated in FIG. 4 further comprises, in operation D, forming a circumferential opening 412 in the oxide layer above the flat region 410, and completing an electrically conductive front contact 411 in the opening, the front contact extending through the front surface 402 of the semiconductor substrate in the flat region to an upper part 413 of the of the semiconductor substrate above the induced junction 403.

Further, an electrically conductive back contact 414 on the back surface 404 of the semiconductor substrate opposite to the front surface 402 is also completed in operation D.

The front and the back contacts may be, for example, in accordance with the front and back contacts discussed above with reference to FIG. 3.

In the embodiment illustrated in FIG. 4, said completing of the front contact comprises forming a circumferential metal pad 411b on the p+ doped region 411a. Thus, the completed front contact comprises the p+ doped region 411a in the upper part 413 of the semiconductor substrate, and the metal pad 411b on the p+ doped region.

Said completing of the back contact 414, in turn, comprises forming a metal layer 414b on the n+ doped surface layer 414a in the semiconductor substrate adjacent to the back surface 404 thereof. Thus, the completed back contact comprises the metal layer 414b, and the n+ doped surface layer 414a of the semiconductor substrate.

The metal pad 411b and the metal layer 414b may be formed, for example, by sputtering aluminum or some other suitable contact metal.

In other embodiments, different types and configurations of the front and back contacts may be formed and present in the photodetector structure 400. In particular, similarly to what was discussed above with reference to FIG. 3, contact layouts may be formed which are different from a single circumferential front contact and a single continuous back contact layer.

Further, it is to be noted that the above operations for forming the front and back contacts represent one example only. In other embodiments, any other appropriate processes may be used to form the contacts. For example, not limiting the range of potential processes, various laser-aided processing methods may be used in forming the contacts, such as laser transfer of metal contacts and dopants, or laser induced chemical vapor deposition of metals. Using processes other than that discussed above with reference to FIG. 4, the contacts may be formed at any appropriate phases of the overall manufacturing process.

In any of the embodiments discussed above, the semiconductor substrate may have a thickness in the vertical direction, for example, in the range of 100 or 200 to 500 μm. The thickness should be high enough to ensure sufficiently large portion of incident light is absorbed within the substrate. In embodiments were the external charge is provided by an oxide layer such as an oxide layer comprising aluminum oxide $Al_2O_3$, the oxide layer thickness may be, for example, in the range of some tens of nanometers.

In the above, aspects are discussed concerning photodetector structures and photodetectors. However, in other embodiments, structures and devices as those which are above referred to photodetectors or photodetector structures may be used for detecting electromagnetic radiation also outside the visible part of the electromagnetic spectrum, and also particle radiation. In this sense, all what is stated above concerning photodetectors and photodetector structures apply, mutatis mutandis, also more generally to radiation detectors and radiation detector structures for detecting electromagnetic radiation or particle radiation, including ionizing radiation.

Suitable detecting performance for such other types of radiation may be achieved, for example, by biasing the detector structure with higher voltage than that used for photodetector operation.

The (optical) conversion layer, or a layer of black silicon, may provide advantages also in the case of electromagnetic radiation outside the visible spectrum and/or particle radiation. For example, in such layer, the surface area is multiple in comparison to a flat surface, so much higher charge may be created, resulting in deeper induction, in turn resulting in better conductivity, which is advantageous in any detector application.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or acts.

The invention claimed is:

1. A photodetector structure comprising an n-type semiconductor substrate extending substantially along a horizontal plane and having a front surface defining a front side of the photodetector structure; and a transparent oxide layer having a negative net charge on the front surface of the semiconductor substrate; an induced junction being induced in the semiconductor substrate by the negative net charge of the oxide layer.

2. A photodetector structure as defined in claim 1, wherein the semiconductor substrate has a bulk refractive index, and the front surface of the semiconductor substrate comprises substantially vertically extending high aspect ratio nanostructures forming an optical conversion layer having an effective refractive index gradually changing towards the bulk refractive index to reduce reflection of light incident on the photodetector structure from the front side thereof; the oxide layer covering substantially conformally the front surface of the semiconductor substrate with the nanostructures.

3. A photodetector structure as defined in claim 2, wherein the n-type semiconductor substrate comprises n-type silicon, and the optical conversion layer comprises black silicon.

4. A photodetector structure as defined in claim 1, wherein the oxide layer comprises aluminum oxide $Al_2O_3$.

5. A photodetector structure as defined in claim 1, wherein the semiconductor substrate has a back surface opposite to the front surface; the photodetector surface further comprising an electrically conductive front contact extending through the front surface of the semiconductor substrate to an upper portion of the semiconductor substrate above the induced junction; and an electrically conductive back contact on the back surface of the semiconductor substrate.

6. A photodetector structure comprising a semiconductor substrate extending substantially along a horizontal plane and having a bulk refractive index and a front surface defining a front side of the photodetector structure, the front surface comprising high aspect ratio nanostructures forming an optical conversion layer having an effective refractive index gradually changing towards the bulk refractive index to reduce reflection of light incident on the photodetector structure from the front side thereof; the semiconductor substrate comprising an induced junction, wherein the semiconductor substrate comprises n-type silicon, and the optical conversion layer comprises black silicon, and wherein the photodetector structure further comprises a transparent oxide layer with a negative net charge covering substantially conformally the front surface of the semiconductor substrate with the nanostructures, the induced junction being induced by the negative net charge of the oxide layer.

7. A photodetector structure as defined in claim 6, wherein the oxide layer comprises aluminum oxide $Al_2O_3$.

8. A photodetector structure as defined in claim 6, wherein the semiconductor substrate has a back surface opposite to the front surface; the front surface of the semiconductor substrate having a flat region free of the nanostructures; the photodetector structure further comprising an electrically conductive front contact extending through the front surface of the semiconductor substrate in the flat region to an upper part of the of the semiconductor substrate above the induced junction, and an electrically conductive back contact on the back surface of the semiconductor substrate.

9. A method for manufacturing a photodetector structure, comprising:
providing a semiconductor substrate extending substantially along a horizontal plane and having a bulk refractive index and a front surface defining a front side of the photodetector structure;
forming an optical conversion layer having an effective refractive index gradually changing towards the bulk refractive index to reduce reflection of light incident on the photodetector structure from the front side of thereof; forming the optical conversion layer comprising structuring the front surface of the semiconductor substrate so as to form substantially vertically extending high aspect ratio nanostructures thereon; and
providing external charge on the front surface of the semiconductor substrate so as to induce an induced junction in the semiconductor substrate,
wherein the semiconductor substrate comprises n-type silicon, and the optical conversion layer is formed so as to comprise black silicon and wherein providing the external charge comprises forming a transparent oxide layer with a negative net charge covering substantially conformally the front surface of the semiconductor substrate with the nanostructures, the induced junction being induced by the negative net charge of the oxide layer.

10. A method as defined in claim 9, wherein the oxide layer is formed so as to comprise aluminum oxide $Al_2O_3$.

11. A method as defined in claim 9, wherein the oxide layer is formed by atomic layer deposition ALD.

12. A method as defined in claim 9, wherein the semiconductor substrate has a back surface opposite to the front surface; the method further comprising forming an electrically conductive front contact extending through the front surface of the semiconductor substrate to an upper part of the of the semiconductor substrate above the induced junction, and an electrically conductive back contact on the back surface of the semiconductor substrate.

13. A method as defined in claim 12, wherein structuring the front surface of the semiconductor substrate is carried out so as to leave a flat region without nanostructures on the front surface of the semiconductor substrate; the electrically conductive front contact being formed on the flat region.

* * * * *